United States Patent [19]

Hamaguchi et al.

[11] Patent Number: 5,631,753

[45] Date of Patent: May 20, 1997

[54] BLACK MATRIX BASE BOARD AND MANUFACTURING METHOD THEREFOR, AND LIQUID CRYSTAL DISPLAY PANEL AND MANUFACTURING METHOD THEREFOR

[75] Inventors: Takuya Hamaguchi; Hiroyuki Kusukawa; Yasutomo Teshima; Ryutaro Harada; Satoshi Mitamura, all of Tokyo-to, Japan

[73] Assignee: Dai Nippon Printing Co., Ltd., Japan

[21] Appl. No.: 416,517

[22] PCT Filed: Jun. 26, 1992

[86] PCT No.: PCT/JP92/00812

§ 371 Date: Apr. 14, 1993

§ 102(e) Date: Apr. 14, 1993

[87] PCT Pub. No.: WO93/00603

PCT Pub. Date: Jan. 7, 1993

Related U.S. Application Data

[63] Continuation of Ser. No. 969,193, Apr. 14, 1993, abandoned.

[30] Foreign Application Priority Data

| Jun. 28, 1991 | [JP] | Japan | 3-158902 |
| Oct. 29, 1991 | [JP] | Japan | 3-283039 |
| Dec. 10, 1991 | [JP] | Japan | 3-325821 |

[51] Int. Cl.[6] .................................. G02F 1/1335
[52] U.S. Cl. .................................. 349/110; 427/98
[58] Field of Search .......................... 359/67, 68, 54, 359/59, 87; 427/525, 306, 307, 438, 98, 169, 164

[56] References Cited

U.S. PATENT DOCUMENTS

| 3,615,471 | 10/1971 | Lenoble | 96/38.3 |
| 3,779,758 | 12/1973 | Polichette | 96/36.2 |
| 3,900,320 | 8/1975 | Rolker et al. | 96/35.1 |
| 4,511,614 | 4/1985 | Greeson et al. | 428/141 |
| 4,594,311 | 6/1986 | Frisch et al. | 430/315 |
| 4,639,088 | 1/1987 | Suginoya et al. | 359/68 |
| 4,666,735 | 5/1987 | Hoover et al. | 427/43.1 |
| 4,952,286 | 8/1990 | Blandon et al. | 204/15 |
| 4,981,725 | 1/1991 | Nuzzi et al. | 427/304 |
| 5,049,230 | 9/1991 | Patel et al. | 156/628 |
| 5,091,792 | 2/1992 | Kaida | 359/67 |
| 5,121,237 | 6/1992 | Ikeda et al. | 359/67 |
| 5,183,692 | 2/1993 | Mukerji et al. | 427/304 |
| 5,213,850 | 5/1993 | Matsumura et al. | 427/508 |
| 5,248,576 | 9/1993 | Yokoyama et al. | 359/85 |
| 5,305,154 | 4/1994 | Sumi et al. | 359/67 |
| 5,439,582 | 8/1995 | Oka et al. | 205/135 |

FOREIGN PATENT DOCUMENTS

| 63-266424 | 11/1988 | Japan . |
| 63-274929 | 11/1988 | Japan . |

*Primary Examiner*—William L. Sikes
*Assistant Examiner*—James A. Dudek
*Attorney, Agent, or Firm*—Ladas & Parry

[57] ABSTRACT

The black matrix substrate used for a flat display such as a liquid crystal display panel, an imager such as CCD or a color filter such as a color sensor comprises a transparent substrate and a light-shielding layer formed on the transparent substrate, and the light-shielding layer contains metallic particles inside thereof, whereby the light-shielding layer can show high light-shielding properties and a low reflectance. In the liquid crystal display panel comprising substrates facing each other and a liquid crystal sealed between the substrates, a semiconductor device provided on one of the substrates has a light-shielding layer which contains metallic particles inside thereof, whereby the semiconductor device can be effectively protected and the liquid crystal display panel has a high contrast.

25 Claims, 8 Drawing Sheets

LIGHT

BLACK MATRIX BASE BOARD AND MANUFACTURING METHOD THEREFOR, AND LIQUID CRYSTAL DISPLAY PANEL AND MANUFACTURING METHOD THEREFOR

This is a continuation of application Ser. No. 07/969,193 filed on Apr. 14, 1993, now abandoned.

FIELD OF THE INVENTION

The present invention relates to black matrix substrates and processes for preparing the same, more particularly to black matrix substrates which show high dimensional accuracy and excellent light-shielding properties and processes for preparing the same. Further, the invention also relates to liquid crystal display panels and processes for preparing the same, more particularly to liquid crystal display panels of high precision which can be easily prepared.

BACKGROUND OF THE INVENTION

Monochromatic or color liquid crystal display panels have been recently paid much attention as flat displays. The liquid crystal display panels include those of active matrix system and those of simple matrix system. In the color liquid crystal display panels of both systems, a color filter is used. For example, a color liquid crystal display panel of active matrix system using a thin film transistor (TFT) is formed by placing a TFT substrate and a color filter to face each other and sealing a liquid crystal layer between a substrate of the TFT substrate and a substrate of the color filter. For the color filter, three primaries of red (R), green (G) and blue (B) are used, and the liquid crystal acts as a shutter by switching on or off an electrode corresponding to each pixel of R, G and B, whereby transmission of each light of the three primaries is controlled to effect color display. On the other hand, the TFT substrate comprises a transparent substrate, a semiconductor device and a pixel electrode, said semiconductor device and said pixel electrode being formed integrally with each other on the transparent substrate. The semiconductor device is a thin film transistor (TFT) composed of a gate electrode, a gate insulating layer, a semiconductor layer made of amorphous silicon (a-Si) or the like, a source electrode and a drain electrode. One end of the drain electrode is connected with the semiconductor layer, and the other end thereof is connected with the pixel electrode. Further, an alignment film is formed to cover the semiconductor device and the pixel electrode.

In the semiconductor layer made of a-Si or the like, however, an photocurrent is large, and therefor the semiconductor device is required to be shielded from light to inhibit leaking of the photocurrent. Accordingly, the color filter is constructed by forming a light-shielding layer (black matrix), colored layers of R, G and B, a overcoat, a transparent electrode layer and an orientation layer on a transparent substrate. The light-shielding layer also serves to enhance chromaticness and display contrast in addition to the inhibition of leaking of the photocurrent. Such a light-shielding layer as mentioned above is required to be provided not only in the color liquid crystal display panels but also in the monochromatic liquid crystal display panels for the same reason.

As the light-shielding layer, there have been conventionally known a light-shielding layer obtained by forming a relief through photoetching of a chromium thin film, a light-shielding layer obtained by dyeing a hydrophilic resin relief, a light-shielding layer obtained by forming a relief using a photosensitive resin in which a black pigment is dispersed (see: Japanese Patent Laid-Open Publications No. 1(1989)-102429, No. 1(1989)-239523 and No. 2(1990)-239204), a light-shielding layer obtained by electrodeposition of a black electrodeposition paint, a light-shielding layer obtained by metal-plating with a given pattern on a cured polymer film containing a catalyst for electroless plating to form a metallic thin film (see: Japanese Patent Laid-Open Publication No. 2(1990)-251801), and a light-shielding layer obtained by printing.

However, there are various problems in those conventional light-shielding layers. For example, the light-shielding layer obtained by forming a relief through photoetching of a chromium thin film needs a vacuum process such as deposition or sputtering in its preparation, or the process for preparing the light-shielding layer is complicated, resulting in high production cost, though the layer shows high dimensional accuracy. Further, in this light-shielding layer, a reflectance of chromium is necessarily restrained to enhance the display contrast under an intense external light, and therefore it is necessary to further conduct sputtering of chromium having a low reflectance, resulting in much higher production cost. The light-shielding layer obtained by using a photosensitive resin in which a black dye or a black pigment is dispersed, though the production cost of this layer is low, has such problems that a photo process becomes unstable and satisfactory light-shielding properties can be hardly obtained because the photosensitive resin is black, whereby black matrix of high quality cannot be obtained. The light-shielding layer obtained by forming a metallic thin film through electroless plating has a problem of high reflectance because metal is deposited only on a surface of the curable film.

By the way, in the process for preparing a liquid crystal display panel, the light-shielding layer is required to be formed with extremely high accuracy from the viewpoint of alignment of the light-shielding layer and the semiconductor device on the TFT substrate, and this alignment operation is also required to be made with high accuracy. Therefore, yields of the liquid crystal display panels are compelled to be reduced in the conventional process. For shielding the semiconductor device from light much more effectively, a method of enlarging a width of the light-shielding layer can be mentioned. However, this method still has a problem. That is, if the width of the light-shielding layer is enlarged, an aperture ratio of the resulting liquid crystal display panel becomes small, and thereby brightness of the panel is reduced.

To solve the above-mentioned problems, a method of forming a light-shielding layer directly on the semiconductor device of the TFT substrate is carried out (see: Japanese Patent Laid-Open Publication No. 60(2985)-184228). Even by the use of this method, however, there has not been obtained yet a liquid crystal display panel having a light-shielding layer which shows a high optical density, a low reflectance and a high dimensional accuracy and which can be easily prepared without using a vacuum process.

It is an object of the present invention to provide a black matrix substrate employable for a flat display such as a liquid crystal display panel, an imager such as CCD or a color filter of such as a color sensor and showing a high dimensional accuracy, excellent light-shielding properties and a low reflectance, and a process by which such a black matrix substrate as mentioned above can be prepared at a low cost.

It is another object of the invention to provide a color or monochromatic liquid crystal display panel in which display can be effected with high precision and high contrast and which can be easily prepared, and a process for preparing such a color or monochromatic liquid crystal display panel as mentioned above.

DISCLOSURE OF THE INVENTION

The black matrix substrate according to the invention has a structure comprising a transparent substrate and a light-shielding layer provided on the transparent substrate, and the light-shielding layer contains metallic particles inside thereof, whereby the light-shielding layer shows excellent light-shielding properties and has a low reflectance.

The process for preparing a black matrix substrate according to the invention is a process comprising the steps of exposing to light a photosensitive resin layer containing a hydrophilic resin, said photosensitive resin layer being formed on a transparent substrate, through a photo mask having a pattern for a black matrix, developing the photosensitive resin layer to form a relief on the transparent substrate, immersing the transparent substrate in an aqueous solution of a metallic compound serving as a catalyst for electroless plating, washing with water and drying the transparent substrate, and then bringing the relief on the transparent substrate into contact with an electroless plating solution to form a light-shielding layer having a pattern for a black matrix.

In another embodiment, the process for preparing a black matrix substrate according to the invention is a process comprising the steps of exposing to light a photosensitive resin layer containing a hydrophilic resin and a metallic compound serving as a catalyst for electroless plating, said photosensitive resin layer being formed on a transparent substrate, through a photo mask having a pattern for a black matrix, developing the photosensitive resin layer, washing with water and drying the transparent substrate to form a relief on the transparent substrate, and then bringing the relief on the transparent substrate into contact with an electroless plating solution to form a light-shielding layer having a pattern for a black matrix.

In a further embodiment, the process for preparing a black matrix substrate according to the invention is a process comprising the steps of forming on a transparent substrate a photosensitive resin layer containing a compound having at least one of a diazo group and an azido group, a metallic compound serving as a catalyst for electroless plating and a hydrophilic resin, exposing the resist layer to light through a photo mask having a pattern for a black matrix, and bringing the resist layer into contact with an electroless plating solution to form a light-shielding layer having a pattern for a black matrix.

The black matrix substrate obtained by the above processes has a light-shielding layer (black matrix) containing a metal inside thereof, and this black matrix has a high optical density, a low reflectance and a high dimensional accuracy. Accordingly, the black matrix substrate can be used for a color filter showing high reliability and high contrast. Further, since the black matrix substrate can be prepared without conducting a vacuum process, the production cost can be lowered.

The liquid crystal display panel according to the invention comprises substrates facing each other and a liquid crystal sealed between the substrates, and at least one of the substrates is provided with a semiconductor device having a light-shielding layer containing metallic particles inside thereof. Owing to this structure, shielding of the semiconductor device from light can be secured by the light-shielding layer, and brightness of the display panel can be enhanced.

The process for preparing a liquid crystal display panel comprising substrates facing each other and a liquid crystal sealed between the substrates, at least one of said substrates being provided with a semiconductor device, according to the invention is a process comprising the steps of forming a photosensitive resin layer containing a hydrophilic resin on a semiconductor device side of the substrate provided with the semiconductor device, exposing to light the photosensitive resin layer through a photo mask having a pattern for a black matrix, developing the photosensitive resin layer to form a relief on the semiconductor device, immersing the substrate in an aqueous solution of a metallic compound serving as a catalyst for electroless plating, washing with water and drying the substrate, and then bringing the relief into contact with an electroless plating solution to form a light-shielding layer having a pattern for a black matrix on the semiconductor device.

In another embodiment, the process for preparing a liquid crystal display panel comprising substrates facing each other and a liquid crystal sealed between the substrates, at least one of said substrates being provided with a semiconductor device, according to the invention is a process comprising the steps of forming a photosensitive resin layer containing a hydrophilic resin and a metallic compound serving as a catalyst for electroless plating on a semiconductor device side of the substrate provided with the semiconductor device, exposing to light the photosensitive resin layer through a photo mask having a pattern for a black matrix, developing the photosensitive resin layer, washing with water and drying the substrate to form a relief on the semiconductor device, and then bringing the relief into contact with an electroless plating solution to form a light-shielding layer having a pattern for a black matrix on the semiconductor device.

In the liquid crystal display panel obtained by the above processes of the invention, the semiconductor device formed on the substrate is per se provided with a light-shielding layer, and this light-shielding layer contains metallic particles inside thereof. Therefore, the light-shielding layer shows a high optical density and a low reflectance, whereby shielding of the semiconductor device from light can be secured without enlarging a width of the light-shielding layer differently from the conventional case, and the aperture ratio can be increased. Further, an alignment operation of the semiconductor device and the other substrate can be easily made, and the semiconductor device can be stably driven.

BEST MODE FOR CARRYING OUT THE INVENTION

The present invention is further described referring to the attached drawings.

Figure 1:
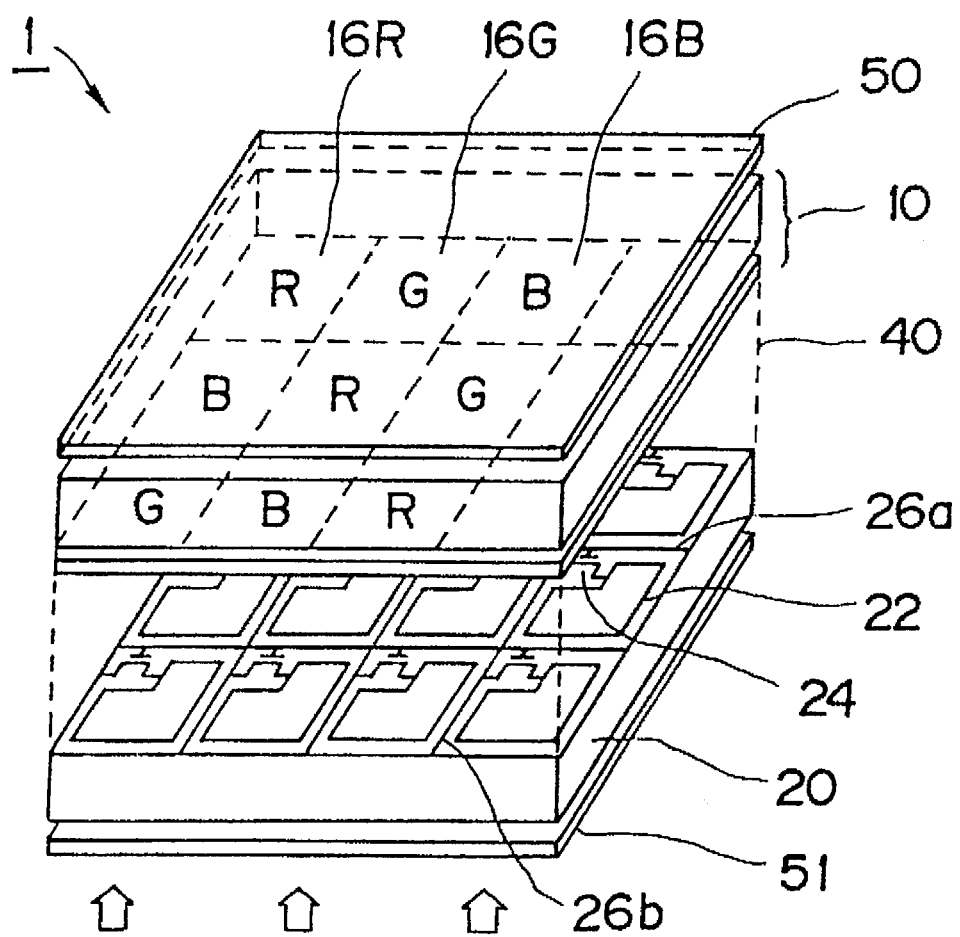
FIG. 1 is a perspective view showing one example of a active matrix liquid crystal display using a black matrix substrate prepared by the invention.
Figure 2:
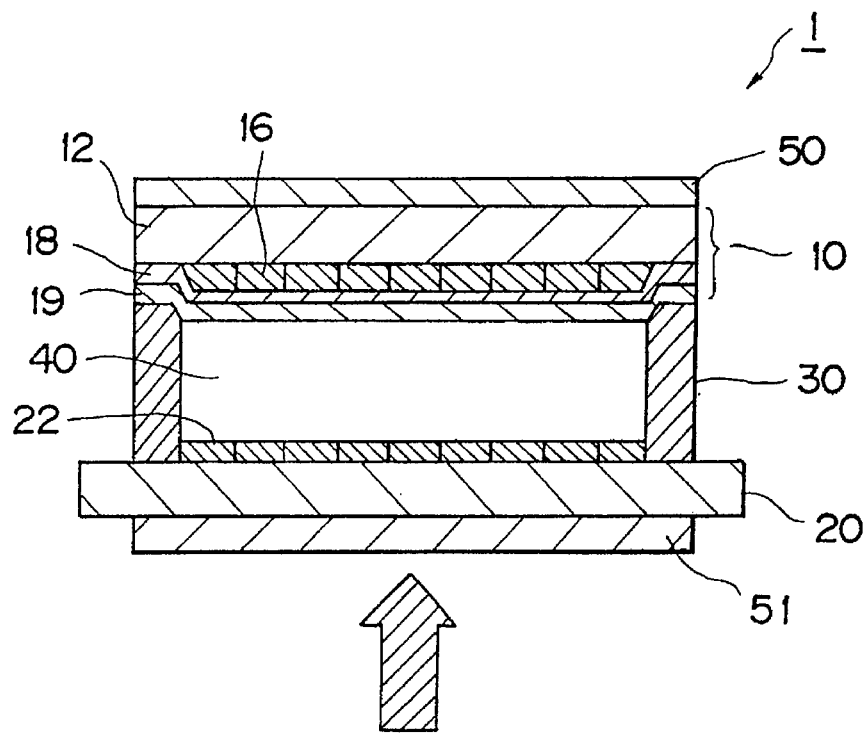
FIG. 2 is a schematic sectional view of the liquid crystal display shown in FIG. 1.

FIG. 1 is a perspective view showing one example of a liquid crystal display (LCD) of active matrix system using a black matrix substrate prepared in accordance with the invention, and FIG. 2 is a schematic sectional view of said liquid crystal display. In FIGS. 1 and 2, LCD 1 is constructed by placing a color filter 10 and a transparent glass substrate 20 to face each other by way of a sealing material 30, forming therebetween a liquid crystal layer 40 made of twisted nematic (TN) liquid crystal and having a thickness of about 5 to 10 μm, and arranging polarizing films 50 and 51 on the outer sides of the color filter 10 and the transparent glass substrate 20, respectively.

Figure 3:
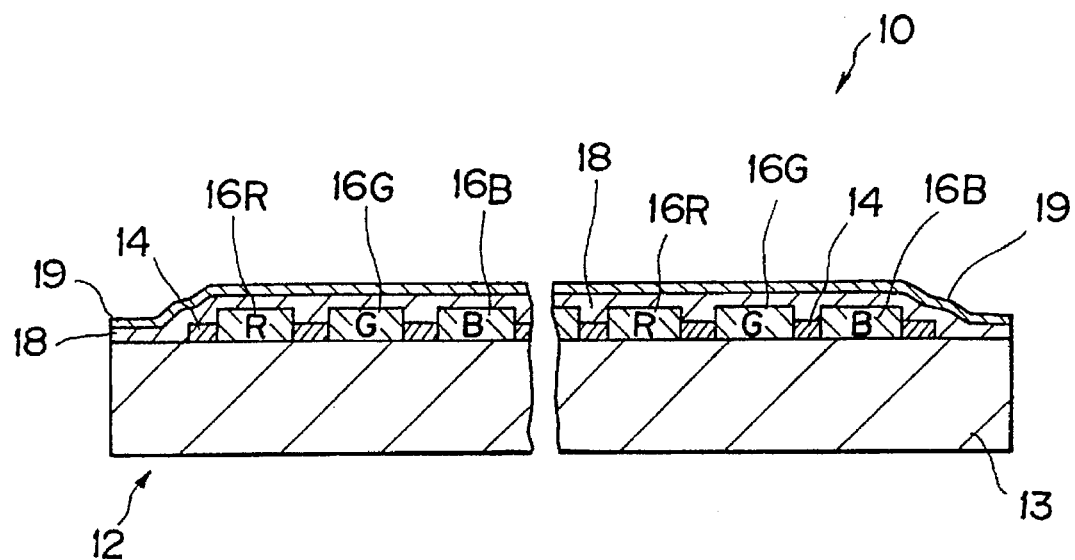
FIG. 3 is an enlarged partial sectional view of a color filter used for the liquid crystal display shown in FIG. 1.

FIG. 3 is an enlarged partial sectional view of the color filter 10. In FIG. 3, the color filter 10 includes a black matrix substrate 12 composed of a transparent substrate 13 and a light-shielding layer (black matrix) 14 formed on the substrate 13, a colored layer 16 formed among the black matrix 14 of the black matrix substrate 12, a overcoat 18 provided to cover the black matrix 14 and the colored layer 16, and a transparent electrode 19. This color filter 10 is arranged so that the transparent electrode 19 is positioned on the side of the liquid crystal layer 40. The colored layer 16 consists of a red pattern 16R, a green pattern 16G and a blue pattern 16B, and the arrangement of those color patterns is mosaic arrangement as shown in FIG. 1. The arrangement of the color patterns is in no way limited to the mosaic arrangement, and other arrangements such as triangle arrangement and stripe arrangement are available.

On the transparent glass substrate 20, display electrodes 22 are provided correspondingly to each color patterns 16R, 16G and 16B, and each of the display electrodes 22 has a thin film transistor (TFT) 24. Further, among the display electrodes 22 are laid a scanning line (gate bus line) 26a and a data line 26b correspondingly to the black matrix 14.

In such LCD 1 as mentioned above, each of the color patterns 16R, 16G and 16B constitutes a pixel. When the display electrode corresponding to each pixel is switched on or off under irradiation with light from the side of the polarizing film 51, the liquid crystal layer 40 acts as a shutter and the light is transmitted by each pixels of the color patterns 16R, 16G and 16B to effect color display.

Examples of materials employable for the transparent substrate 13 of the black matrix substrate 12 constituting the color filter 10 include rigid materials having no flexibility such as quartz glass, low-expanded glass and soda-lime glass, and flexible materials having flexibility such as transparent resin film and optical resin plate. Among various materials, a 7059 glass (available from Corning Corporation) is particularly suitable for a color filter used for LCD of active matrix system, because it has a small coefficient of thermal expansion and is excellent in dimensional stability and workability in a high temperature heating treatment and further it is a non-alkali glass containing no alkali component.

Figure 4:
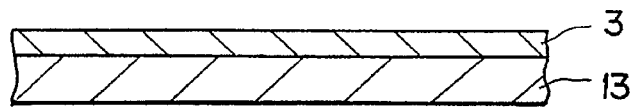
FIG. 4A–4E is to show views illustrating steps of a process for preparing a black matrix substrate, in one embodiment, according to the invention.
Figure 4:
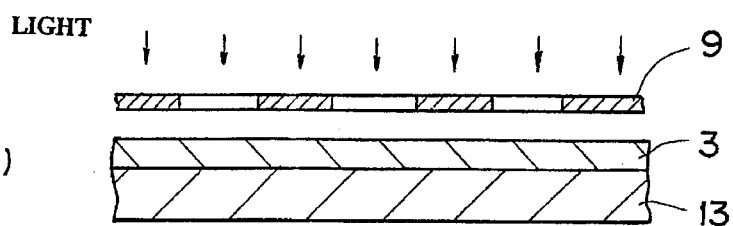
Figure 4:
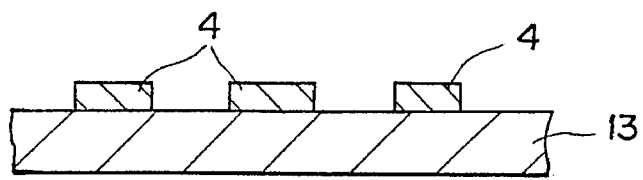
Figure 4:
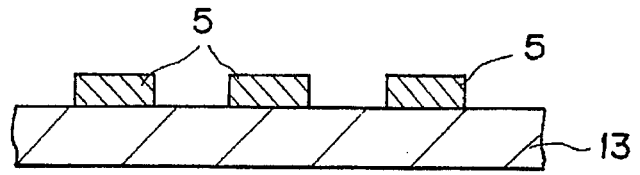
Figure 4:
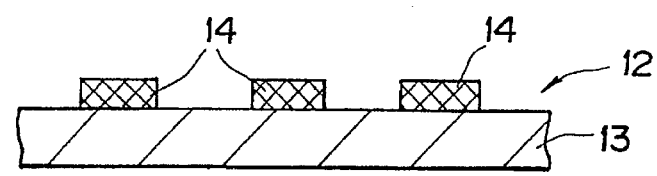

One embodiment of the process for preparing the black matrix substrate 12 according to the invention is now illustrated referring to FIG. 4.

In the first place, a photosensitive resin containing a hydrophilic resin is applied onto the transparent substrate 13 to form a photosensitive resin layer 3 having a thickness of 0.1 to 5.0 μm, preferably 0.1 to 2.0 μm (FIG. 4A). When the thickness of the photosensitive resin layer is less than 0.1 μm, deposition of metallic particles becomes insufficient, and hence a light-shielding layer having a satisfactory optical density cannot been obtained. When the thickness thereof exceeds 5.0 μm, a resolution is reduced. The thickness of the photosensitive resin layer is more preferably not more than 2.0 μm from the viewpoint of the surface roughness. In the next place, the photosensitive resin layer 3 is exposed to light through a photo mask 9 for a black matrix (FIG. 4B). Then, thus exposed photosensitive resin layer 3 is developed to form a relief having a pattern for a black matrix (FIG. 4C). Thereafter, the transparent substrate 13 is immersed in an aqueous solution of a metallic compound serving as a catalyst for electroless plating, followed by washing with water and drying. The substrate is then subjected to a heat treatment (100° to 200° C., 5 to 30 minutes) to make the above relief a catalyst-containing relief 5 (FIG. 4D). The catalyst-containing relief 5 on the transparent substrate 13 is brought into contact with an electroless plating solution to make the catalyst-containing relief a light-shielding layer, whereby a black matrix 14 is formed (FIG. 4E).

In the process for preparing a black matrix substrate according to the invention, it is possible that after formation of the above-mentioned relief 4 (FIG. 4C), the transparent substrate is subjected to a heat treatment (70° to 150° C., 5 to 30 minutes) and then immersed in an aqueous solution of a metallic compound serving as a catalyst for electroless plating, followed by washing with water and drying, to form a catalyst-containing relief 5 (FIG. 4D). In this case, it is preferred to further conduct a heat treatment (150° to 250° C., 30 minutes to 2 hours) after the black matrix 14 is formed by electroless plating (FIG. 4E). By conducting the heat treatment before the formation of the catalyst-containing relief 5 as described above, the relief 4 can be uniformly dried, and the aqueous solution of a metallic compound serving as a catalyst for electroless plating permeates uniformly into the relief 4. Further, a period of time required for the electroless plating can be controlled by adjusting conditions of the heat treatment. Accordingly, metal particles deposit almost uniformly within the whole of the catalyst-containing relief 5, and hence the resulting black matrix 14 is almost free from lifting, peeling off, etc.

Figure 5A:
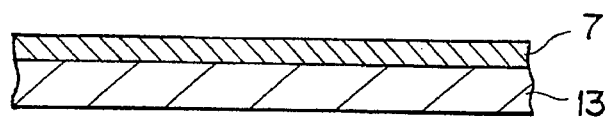
FIG. 5A–5D is to show views illustrating steps of a process for preparing a black matrix substrate, in other embodiment, according to the invention.
Figure 5B:
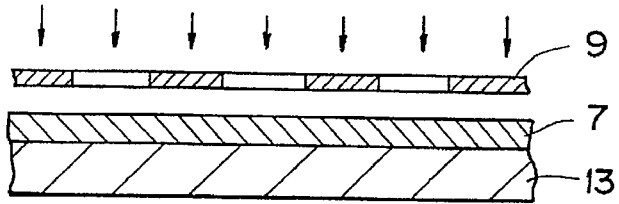
Figure 5C:
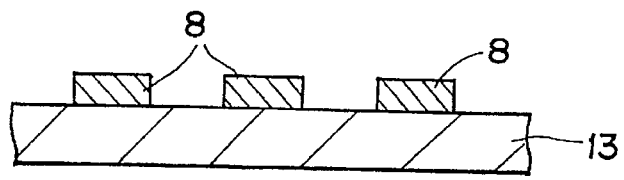
Figure 5D:
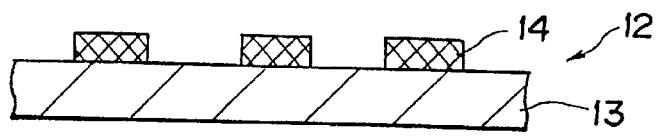

Other embodiment of the process for preparing the black matrix substrate 12 according to the invention is described below referring to FIG. 5. In the first place, a photosensitive resin containing a hydrophilic resin and an aqueous solution of a metallic compound serving as a catalyst for electroless plating is applied onto the transparent substrate 13 to form a photosensitive resin layer 7 having a thickness of about 0.1 to 5.0 μm, preferably about 0.1 to 2.0 μm (FIG. 5A). In the next place, the photosensitive resin layer 7 is exposed to light through a photo mask 9 for a black matrix (FIG. 5B). Then, thus exposed photosensitive resin layer is developed and dried to form a catalyst-containing relief 8 having a pattern for a black matrix (FIG. 5C). Thereafter, a heat treatment (70° to 150° C., 5 to 30 minutes) may be carried out. Then, the catalyst-containing relief 8 on the transparent substrate 13 is brought into contact with an electroless plating solution to make the catalyst-containing relief a light-shielding layer, whereby a black matrix 14 is formed (FIG. 5D). Thereafter, it is preferred to conduct a heat treatment (150° to 250° C., 30 minutes to 2 hours).

The photosensitive resins employable in the invention are resists imparted with light sensitivity. Such resists can be obtained, for example, by adding compounds or resins having a cross-rinkable photosensitive function groups to hydrophilic resins. Examples of the hydrophilic resins include natural proteins (e.g., gelatin, casein, glue and egg albumin), carboxymethyl cellulose, polyvinyl alcohol, polyacrylic acid, polyacrylamide, polyvinyl pyrrolidone, polyethylene oxide, maleic anhydride copolymers, carboxylic acid modified products of the above resins, and sulfonic acid modified products of the above resins. These hydrophilic resins can be used singly or in combination. Examples of the compounds or resins having a cross-rinkable photosensitive function group include diazonium compounds having diazo group, diazo resins which are reaction products of diazonium compounds and paraformaldehyde, azido compounds having azido group, cinnamic acid condensation resin obtained by condensation of cinnamic acid with polyvinyl alcohol, resin using stilbazolium salt, and ammonium bichromate. As a matter of course, the light-sensitive groups employable for the invention are in no way limited to the above-mentioned cross-rinkable photosensitive function groups. Since the photosensitive resin contains a hydrophilic resin as described above, the electroless plating solution easily permeates into the catalyst-containing relief 5, 8 when the catalyst-containing relief is brought into contact with the electroless plating solution, and metallic particles uniformly deposit within the catalyst-containing relief. Accordingly, the resulting black matrix 14 becomes sufficiently black and has a low reflectance, and as a result, the aforementioned problem of reflection by a metal layer associated with the conventional technique of formation of a chromium thin film can be solved.

Examples of the metallic compound serving as a catalyst for electroless plating in the invention include water-soluble salts such as chlorides and nitrates of various metals (e.g., palladium, gold, silver, platinum and copper), and complex compounds of those metals. In the use of the metallic compound, commercially available activators for electroless plating can be per se employed. When such metallic compound is incorporated into the photosensitive resin as described above, the metallic compound is used preferably in an amount of about 0.00001 to 0.001% by weight.

The electroless plating solutions employable in the invention are those containing a reductant, a water-soluble heavy metal salt capable of being reduced, a basic compound to enhance plating speed, reducing efficiency, etc., a pH adjusting agent such as inorganic or organic acid, a buffering agent, a complexing agent to stabilize heavy metal ion, an accelerator, a stabilizer, a surface active agent, etc. Concrete examples of the reductant include hypophosphorous acid, sodium hypophosphite, sodium boron hydride, N-dimethylamine borane, borazine derivative, hydrazine and formalin. Concrete examples of the water soluble heavy metal salts include nickel, cobalt, iron, copper and chromium. Concrete examples of the basic compounds include caustic soda and ammonium hydroxide. Concrete examples of the buffering agents include alkali salts of oxycarboxylic acid (e.g., sodium citrate and sodium acetate), boric acid, carbonic acid, organic acid and inorganic acid. The electroless plating solutions may be used in combination of two or more kinds. For example, it is possible to use first an electroless plating solution containing a boron type reductant capable of easily forming a nucleus (e.g., palladium nucleus in the case of using a palladium compound as the metallic compound serving as a catalyst for electroless plating), for example, sodium boron hydride, and then to use an electroless plating solution containing a hypophosphorous acid type reductant which is fast in the metal deposition speed.

In the case of using an electroless plating solution containing a boron type reductant, a temperature of the electroless plating solution in the electroless plating stage is preferably in the range of about 10° to 60° C. When the temperature of the electroless plating solution exceeds 60° C., the plating speed becomes too high, and thereby the light-shielding layer sometimes suffer metallic gloss.

Further, other embodiment of the process for preparing the black matrix substrate 12 according to the invention is illustrated below referring to FIG. 6.

In the first place, a photosensitive resin containing a hydrophilic resin, a compound having diazo group or azido group and a metallic compound serving as a catalyst for electroless plating is applied onto the transparent substrate 13 and dried, to form a photosensitive resin layer 3 having a thickness of about 0.1 to 5.0 μm, preferably about 0.1 to 2.0 μm (FIG. 6A). It is well known that the compound having diazo group or azido group functions to inhibit plating in the stage of electroless plating, and that when a resist containing this compound, a hydrophilic resin and a compound serving as a catalyst for electroless plating is subjected to pattern exposure and then brought into contact with an electroless plating solution, metallic particles are formed within the resist layer by the electroless plating to form a light-shielding layer (see: Japanese Patent Laid-Open Publications No. 57(1982)-104928 and No. 57(1982)-104929). In the next place, the photosensitive resin layer 3 is exposed to light through a photo mask 9 for a black matrix (FIG. 6B). Then, the transparent substrate 13 is brought into contact with an electroless plating solution to deposit metallic particles in the exposed portion by electroless plating, whereby a light-shielding layer (Black matrix) is formed (FIG. 6C).

Furthermore, other embodiment of the process for preparing the black matrix substrate 12 is illustrated below referring to FIG. 7.

Figure 7A:
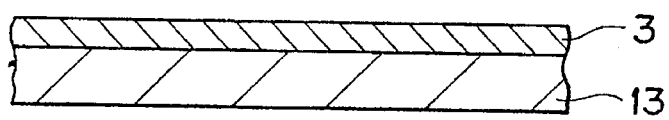
FIG. 7A–7D is to show views illustrating steps of a process for preparing a black matrix substrate, in other embodiment, according to the invention.
Figure 7B:
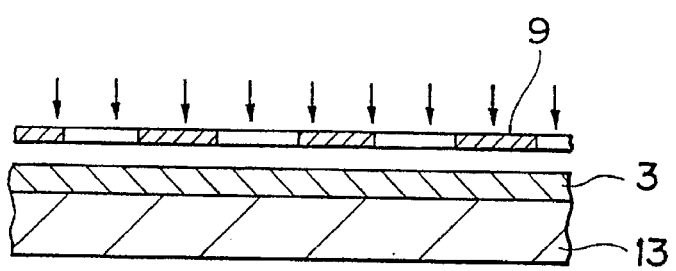
Figure 7C:
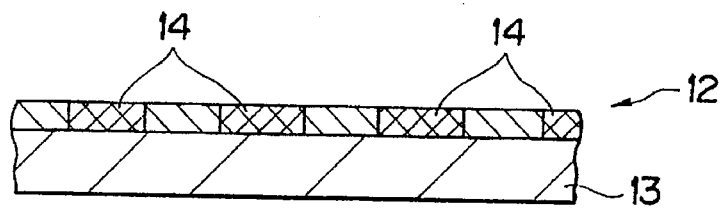
Figure 7D:
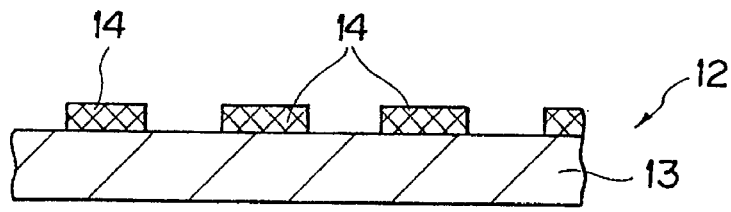

In the first place, a photosensitive resin containing a hydrophilic resin, a compound having diazo group or azido group and a metallic compound serving as a catalyst for electroless plating is applied onto the transparent substrate 13 and dried, to form a photosensitive resin layer 3 having a thickness of about 0.1 to 5.0 μm, preferably about 0.1 to 2.0 μm (FIG. 7A). In the next place, the photosensitive resin layer 3 is exposed to light through a photo mask 9 for a black matrix (FIG. 7B). Then, the transparent substrate 13 is brought into contact with an electroless plating solution to deposit metallic particles in the exposed portion by electroless plating, whereby a light-shielding layer is formed (FIG. 7C). Thereafter, the transparent substrate 13 is developed to remove the unexposed portion, whereby a black matrix 14 is formed (FIG. 7D).

Figure 6:
FIG. 6A–6C is to show views illustrating steps of a process for preparing a black matrix substrate, in other embodiment, according to the invention.
Figure 6:
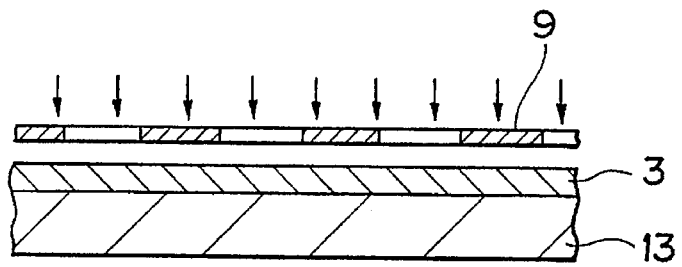
Figure 6:
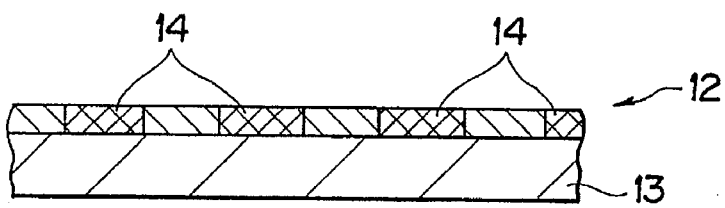

Examples of hydrophilic resins used for preparing such a black matrix substrate as shown in FIG. 6 or FIG. 7 include natural high molecular materials such as gelatin, casein, glue, gum arabic, shellac and egg albumin, carboxymethyl cellulose, polyvinyl alcohol (including partially saponified polyvinyl acetate and modified polyvinyl alcohol), polyacrylic acid, polyacrylamide, polyvinyl pyrrolidone, polyethylene oxide, maleic anhydride copolymers, carboxylic acid modified products of the above resins, and sulfonic acid modified products of the above resins. Other resins than the above-exemplified ones are also employable with the proviso that they are water-soluble or hydrophilic. The hydrophilic resin used in the invention has such a hydrophilic degree that the electroless plating solution permeates into the photosensitive resin layer 3. The hydrophilic resins can be used in combination of plural kinds.

The compound having diazo group or azido group used for the purpose of inhibiting the electroless plating include the following compounds.

Examples of the compounds having diazo group preferably used include p-N,N-diethylaminobenzenediazonium chloride zinc chloride double salt, p-N-ethyl-N-β-hydroxyethylaminobenzenediazonium chloride zinc chloride double salt, p-N, N-dimethylaminobenzenediazonium chloride zinc chloride double salt, 4-morpholinobenzenediazonium chloride zinc chloride double salt, 4-morpholino-2,5-diethoxybenzenediazonium chloride zinc chloride double salt, 4-morpholino-2,5-dibutoxybenzenediazonium chloride zinc chloride double salt, 4-benzoylamino-2,5-diethoxybenzenediazonium chloride zinc chloride double salt, 4-(4-methoxybenzoylamino)-2,5-diethoxybenzenediazonium chloride zinc chloride double salt, 4-(p-toluylmercapto)-2,5-dimethoxybenzenediazonium chloride zinc chloride double salt, 4-diazodiphenylamine zinc chloride double salt, 4-diazo-4'-methoxydiphenylamine zinc chloride double salt, 4-diazo-3-methoxy-diphenylamine zinc chloride double salt, sulfates, phosphates and boron fluoride salts corresponding to the above-mentioned zinc chloride double salts, and diazo resins which are reaction products of these diazonium compounds and paraformaldehyde.

Examples of the compounds having azido group include p-azidobenzalaldehyde, p-azidoacetophenone, p-azidobenzoic acid, p-azidobenzalacetophenone, p-azidobenzalacetone, 4,4'-diazidochalcone, 2,6-bis-(4'-azidobenzal)-acetone, 4,4'-diazidostilbene-2,2'-disulfonic acid, p-azidobenzoyl chloride, 3-azidophthalic anhydride, 4,4'-diazidodiphenylsulfone, p-azidocinnamic acid, and 4,4'-diazidobenzoylacetone-2,2'-sodiumsulfonate.

As the metallic compound and the electroless plating solution used herein, the above-exemplified metallic compounds and electroless plating solutions can be employed.

Examples of the developing solutions used for removing the unexposed portion (other portion than the black matrix pattern) after the formation of the light-shielding layer for a black matrix include water, warm water, and inorganic or organic alkali such as NaOH, KOH, $Na_2CO_3$, tetramethylammonium hydroxide and choline. They can be used in accordance with a conventional manner.

In any of the processes for preparing a black matrix substrate mentioned above, a reflectance of the obtained light-shielding layer at a wavelength of 545 nm is at most 30%, generally not more than 5%. This reflectance is extremely lower than a reflectance (50 to 80%) of a conventional light-shielding layer made of chromium thin film, and therefore display quality of very high level can be obtained.

The metallic particles dispersed within the light-shielding layer have a particle diameter of at most 0.05 μm, generally in the range of 0.01 to 0.02 μm, and owing to the metallic particles, the light-shielding layer is a uniform and homogeneous film.

Further, in any of the aforesaid processes for preparing a black matrix substrate, a light-shielding layer having an optical density of not less than 3.0 can be obtained by varying the plating time, but the optical density of the light-shielding layer is preferably not less than 1.5 from the viewpoints of the aforementioned light-shielding properties against the TFT and improvement of contrast. When the optical density of the light-shielding layer is less than 1.5, the light-shielding layer does not have a sufficient light-shielding function, and the obtained substrate cannot be used as a black matrix substrate.

A thickness of the light-shielding layer can also be optionally determined by varying the amount of the photosensitive resin to be applied, but the thickness thereof is generally in the range of 0.1 to 5.0 μm, preferably 0.1 to 2.0 μm, from the viewpoints of the aforementioned surface roughness, resolution and optical density of the resulting black matrix substrate.

The colored layers of R, G and B can be formed on circumferences of the black matrix 14 of the black matrix substrate 12 (i.e., areas other than the black matrix 14 on the transparent substrate 13 in the embodiments shown in FIGS. 4, 5 and 7, and the unexposed portion of the photosensitive resin layer in the embodiment shown in FIG. 6) by conventionally known methods such as dyeing method, dispersing method, printing method and electrodeposition. These methods may be used in combination.

The overcoat 18 provided to cover the black matrix 14 and the colored layer 16 of the color filter 10 is for the purpose of improving surface roughness, enhancing reliability and preventing contamination, of the color filter 10. The overcoat 18 can be formed using transparent resins such as acrylic resins, epoxy resins and polyimide resins or transparent inorganic compounds such as silicon dioxide. A thickness of the overcoat 18 is preferably in the range of about 0.1 to 10 μm.

An indium tin oxide (ITO) film can be used as the transparent electrode 19. The ITO film can be formed by a conventional method such as deposition or sputtering. A thickness of the ITO film is preferably in the range of about 200 to 2,000 Å.

The present invention is described in more detail by the following experiment examples.

EXPERIMENT EXAMPLE 1

Sample 1

A 7059 glass (available from Corning Corporation, thickness: 1.1 mm) was used as a transparent substrate. Onto the transparent substrate was applied a photosensitive resin having the following composition by means of spin coating (rotation speed: 800 r.p.m.), and the photosensitive resin was dried at 70° C. for 5 minutes to form a photosensitive resin layer (thickness: 2 μm).
Composition of the photosensitive resin
A 10% aqueous solution of polyvinyl alcohol (Gosenal T-330, available from Nippon Gosei Kagaku K.K.) 20 parts by weight
A 20% aqueous solution of diazo resin (D-011, available from Shinko Giken K.K.) 0.8 part by weight
Water 15 parts by weight
Then, the photosensitive resin layer was exposed to light through a photo mask for a black matrix (line width: 20 μm). In the exposure, an ultra-high-pressure mercury lamp (2 kw) was used as a light source, and irradiation with the light was carried out for 10 seconds. Thereafter, the photosensitive resin layer was subjected to spray development using water of a normal temperature and then subjected to air drying, to form a relief having a line width of 20 μm.

Subsequently, the transparent substrate was immersed in an aqueous solution of palladium chloride (Red Sumer, available from Nippon Kanigen K.K.) for 10 seconds, then washed with water and dried. The transparent substrate was then subjected to a heat treatment at 150° C. for 15 minutes to make the above relief a catalyst-containing relief.

Thereafter, the transparent substrate was immersed in a nickel plating solution of 30° C. containing a boron type reductant (Top Chemialloy B-1, nickel plating solution available from Okuno Seiyaku K.K.) for 3 minutes, then washed with water and dried to form a light-shielding layer (black matrix). Thus, a black matrix substrate (Sample 1) was obtained.

Samples 2–4

The above procedure for preparing Sample 1 was repeated except for varying the thickness of the photosensitive resin layer to 1 μm, 4 μm and 10 μm, to prepare black matrix substrates (Samples 2 to 4).

Sample 5

Onto the same transparent substrate as used for Sample 1, a photosensitive resin having the following composition was applied by means of spin coating (rotation speed: 800 r.p.m.), and the photosensitive resin was dried at 70° C. for 5 minutes to form a photosensitive resin layer (thickness: 2 μm).
Composition of the photosensitive resin A 10% aqueous solution of polyvinyl alcohol (Gosenal T-330, available from Nippon Gosei Kagaku K.K.) 20 parts by weight A 20% aqueous solution of diazo resin (D-011, available from Shinko Giken K.K.) 0.8 part by weight An aqueous solution of palladium chloride (Red Sumer, available from Nippon Kanigen K.K.) 15 parts by weight Then, the photosensitive resin layer was exposed to light through a photo mask for a black matrix (line width: 20 μm). In the exposure, an ultra-high-pressure mercury lamp (2 kw) was used as a light source, and irradiation with the light was carried out for 10 seconds. Thereafter, the photosensitive resin layer was subjected to spray development using water of a normal temperature and then subjected to air drying, to form a catalyst-containing relief having a line width of 20 μm.

Subsequently, the transparent substrate was immersed in a nickel plating solution of 30° C. containing a boron type reductant (Top Chemialloy B-1, nickel plating solution available from Okuno Seiyaku K.K.) for 20 seconds, and then further immersed in a nickel plating solution of 30° C. containing a hypophosphorous acid type reductant (Tsp55 Nickel, nickel plating solution available from Okuno Seiyaku K.K., A/C=½) for 2 minutes. The transparent substrate was washed with water and dried to form a light-shielding layer (black matrix). Further, the transparent substrate was subjected to a heat treatment at 200° C. for 1 hour to obtain a black matrix substrate (Sample 5).

Samples 6–8

The above procedure for preparing Sample 5 was repeated except for varying the thickness of the photosensitive resin layer to 1 μm, 4 μm and 10 μm, to prepare black matrix substrates (Samples 6 to 8).

Comparative Sample 1

A 7059 glass (available from Corning Corporation, thickness: 1.1 mm) was used as a transparent substrate. This substrate was immersed in a hydrogen fluoride acid to conduct etching of the glass. Thus, a pre-treatment of the surface of the substrate was carried out. Then, tin ion was adsorbed on the surface of the substrate using stannous chloride and a hydrochloric acid. Thereafter, the substrate was subjected to the same palladium chloride treatment and the same electroless nickel plating as those for Sample 1, and then a black matrix substrate (Comparative Sample 1) was obtained in accordance with a conventional process.

Comparative Sample 2

Onto the same transparent substrate as used for Sample 1, a photosensitive resin having the following composition was applied by means of spin coating (rotation speed: 200 r.p.m.), and the photosensitive resin was dried to form a photosensitive resin layer (thickness: 1 μm).
Composition of the photosensitive resin A 10% aqueous solution of gelatin 10 parts by weight A 10% aqueous solution of ammonium bichromate 3 parts by weight Then, the photosensitive resin layer was exposed to light through a photo mask for a black matrix (line width: 20 μm). In the exposure, an ultra-high-pressure mercury lamp (2 kw) was used as a light source, and irradiation with the light was carried out for 10 seconds. Thereafter, the photosensitive resin layer was subjected to spray development using water of a normal temperature and then subjected to air drying, to form a relief for a black matrix having a line width of 20 μm.

Subsequently, the transparent substrate was immersed in a 1% stannous chloride solution (1-N hydrochloric acid acidic solution) of 60° to 70° C. for 60 to 120 seconds, then further immersed in a 0.3% palladium chloride solution (1N hydrochloric acid acidic solution) at 30° C. for 30 to 60 seconds, and washed with water. Immediately after washing with water, the transparent substrate was immersed in a nickel plating solution (Blue Sumer, available from Nippon Kanigen K.K.) of 70° to 80° C. and electroless plating was tried to be made. However, nickel deposited not only in the relief but also in the whole of the substrate because tin was attached onto all surface of the substrate, so that it was impossible to form a black matrix.

Each of the black matrix substrates obtained as above (Samples 1 to 8, Comparative Samples 1 and 2) was measured on an optical density OD of the black matrix, a reflectance R thereof at a wavelength of 545 nm, a resolution thereof (line and space) and particle diameters of the nickel particles. The results obtained by the measurements are set forth in Table 1.

TABLE 1

| Black Matrix Substrate | Optical Density OD | Reflectance R (%) | Resolution (μm) | Diameter of Nickel Particle (μm) |
|---|---|---|---|---|
| Sample 1 | OD ≧ 3.0 | R ≦ 5 | 4 | 0.01–0.02 |
| Sample 2 | OD ≧ 3.0 | R ≦ 5 | 4 | 0.01–0.02 |
| Sample 3 | OD ≧ 3.0 | R ≦ 5 | 6 | 0.01–0.02 |
| Sample 4 | OD ≧ 3.0 | R ≦ 5 | 12 | 0.01–0.02 |
| Sample 5 | OD ≧ 3.0 | R ≦ 5 | 4 | 0.01–0.02 |
| Sample 6 | OD ≧ 3.0 | R ≦ 5 | 4 | 0.01–0.02 |
| Sample 7 | OD ≧ 3.0 | R ≦ 5 | 5 | 0.01–0.02 |
| Sample 8 | OD ≧ 3.0 | R ≦ 5 | 10 | 0.01–0.02 |
| Comp. Sample 1 | OD ≧ 3.0 | R ≧ 50 | 4 | |
| Comp. Sample 2 | OD ≧ 3.0 | R ≧ 50 | unable to be plated | |

EXPERIMENT EXAMPLE 2

Sample 1

Formation of a photosensitive resin layer and exposure of the photosensitive resin layer to light were made in the same manner as those for Sample 1 of Experiment Example 1. Then, the photosensitive resin layer was subjected to spray development using water of a normal temperature, and further subjected to a heat treatment at 100° C. for 30 minutes to form a relief for a black matrix having a line width of 20 μm.

Subsequently, the transparent substrate was immersed in an aqueous solution of palladium chloride (Red Sumer, available from Nippon Kanigen K.K.) for 10 seconds, then washed with water and dried, to make the above relief a catalyst-containing relief.

Thereafter, the transparent substrate was immersed in a nickel plating solution of 30° C. containing a boron type reductant (Top Chemialloy B-1, nickel plating solution available from Okuno Seiyaku K.K.) for 3 minutes, then washed with water and dried to form a light-shielding layer (black matrix). The transparent substrate was then subjected to a heat treatment at 200° C. for 1 hour to obtain a black matrix substrate (Sample 1).

Samples 2–4

The above procedure for preparing Sample 1 was repeated except for varying the thickness of the photosensitive resin layer to 1 μm, 4 μm and 10 μm, to prepare black matrix substrates (Samples 2 to 4).

Each of the black matrix substrates obtained as above (Samples 1 to 4) was measured on an optical density OD of the black matrix, a reflectance R thereof at a wavelength of 545 nm, a resolution thereof (line and space) and particle diameters of nickel particles in the same manner as described in Experiment Example 1. The results obtained by the measurements are set forth in Table 2.

TABLE 2

| Black Matrix Substrate | Optical Density OD | Reflectance R (%) | Resolution (μm) | Diameter of Nickel Particle (μ) |
|---|---|---|---|---|
| Sample 1 | OD ≧ 3.0 | R ≦ 5 | 4 | 0.01–0.02 |
| Sample 2 | OD ≧ 3.0 | R ≦ 5 | 4 | 0.01–0.02 |
| Sample 3 | OD ≧ 3.0 | R ≦ 5 | 6 | 0.01–0.02 |
| Sample 4 | OD ≧ 3.0 | R ≦ 5 | 12 | 0.01–0.02 |

EXPERIMENT EXAMPLE 3

Sample 1

A 7059 glass (available from Corning Corporation, thickness: 1.1 mm) was used as a transparent substrate. Onto the transparent substrate was applied a photosensitive resin having the following composition by means of spin coating (rotation speed: 600 r.p.m.), and the photosensitive resin was dried at 70° C. for 10 minutes to form a photosensitive resin layer (thickness: 3 μm).

Composition of the photosensitive resin

A 10% aqueous solution of polyvinyl alcohol (Gosenal T-330, available from Nippon Gosei Kagaku K.K.) 20 parts by weight A hydrochloric aqueous solution of palladium chloride (Red Sumer, available from Nippon Kanigen K.K.) 15 parts by weight A 20% aqueous solution of diazo resin (D-011, available from Shinko Giken K.K.) 0.8 part by weight Then, the photosensitive resin layer was exposed to light through a photo mask for a black matrix (negative pattern, line width: 20 μm). In the exposure, an ultra-high-pressure mercury lamp (2 kw) was used as a light source, and irradiation with the light was carried out for 20 seconds.

Subsequently, the transparent substrate was immersed in a nickel plating solution of a normal temperature containing a boron type reductant (Top Chemialloy B-1, available from Okuno Seiyaku K.K.) for 30 seconds, and then further immersed in a nickel plating solution of a normal temperature containing a hypophosphorous acid type reductant (Tsp55 Nickel, available from Okuno Seiyaku K.K., A/C= ½) for 1 minute to deposit nickel particles in the exposed portion, whereby a light-shielding layer was formed. The transparent substrate was washed with water and dried to obtain a black matrix substrate.

In the black matrix substrate, the black matrix had an optical density (OD) of not less than 3.0 and a reflectance of not more than 5% at a wavelength of 545 nm. Further, as results of measurements of a resolution (line and space) of the black matrix and a mean particle diameter of the deposited nickel particles, the resolution was 4 μm and the mean particle diameter was in the range of 0.01 to 0.02 μm.

Sample 2

Onto the same transparent substrate as used for Sample 1, a photosensitive resin having the following composition was applied by means of spin coating (rotation speed: 800 r.p.m.), and the photosensitive resin was dried at 70° C. for 10 minutes to form a photosensitive resin layer (thickness: 2 μm).

Composition of the photosensitive resin

A 10% aqueous solution of polyvinyl alcohol (Gosenal T-330, available from Nippon Gosei Kagaku K.K.). 20 parts by weight A hydrochloric aqueous solution of palladium chloride 15 parts by weight A 10% methyl cellosolve solution of diazo monomer (DH-300BF$_4$, available from Daito Kagaku K.K.) 2.0 parts by weight A 20% aqueous solution of diazo resin (D-011, available from Shinko Giken K.K.) 0.2 part by weight Then, the photosensitive resin layer was exposed to light through a photo mask for a black matrix (negative pattern, line width: 20 μm). In the exposure, an ultra-high-pressure mercury lamp (2 kw) was used as a light source, and irradiation with the light was carried out for 30 seconds.

Subsequently, the transparent substrate was immersed in a nickel plating solution of a normal temperature containing a boron type reductant (Top Chemialloy B-1, available from Okuno Seiyaku K.K.) for 10 seconds, and then further immersed in a nickel plating solution of a normal temperature containing a hypophosphorous acid type reductant (Tsp55 Nickel, available from Okuno Seiyaku K.K., A/C= ½) for 60 seconds to deposit nickel particles in the exposed portion, whereby a light-shielding layer was formed. The transparent substrate was washed with water and dried.

Further, the photosensitive resin layer was developed using warm water of 60° C. to remove the unexposed portion of the photosensitive resin layer and remain only the light-shielding layer. Thus, a black matrix substrate was obtained.

In the black matrix substrate, the black matrix had an optical density (OD) of not less than 3.0 and a reflectance of not more than 5% at a wavelength of 545 nm. Further, the resolution of the black matrix (line and space) was 4 μm and the diameters of the nickel particles were in the range of 0.01 to 0.02 μm.

The liquid crystal display panel of the present invention is illustrated below referring to the attached drawings.

Figure 8:
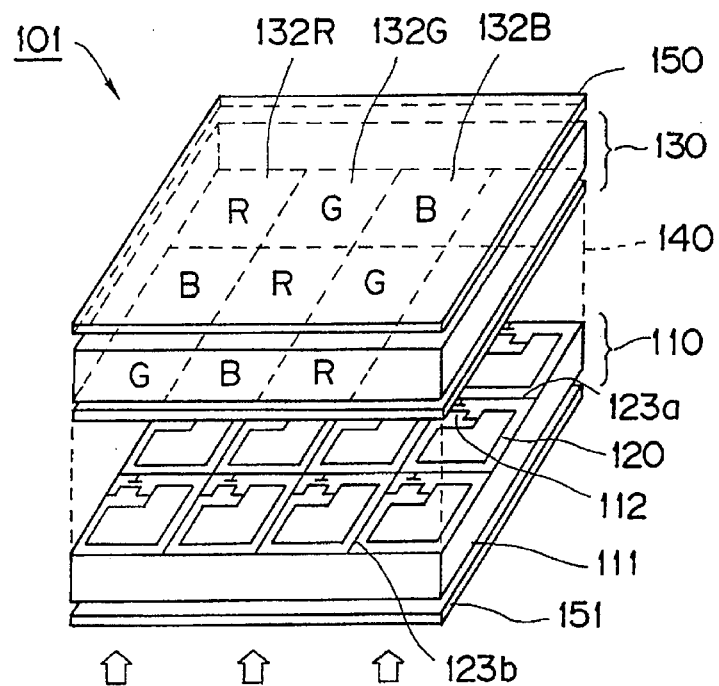
FIG. 8 is a perspective view showing a color liquid crystal display panel including black matrix which is one example of a liquid crystal display panel according to the invention.
Figure 9:
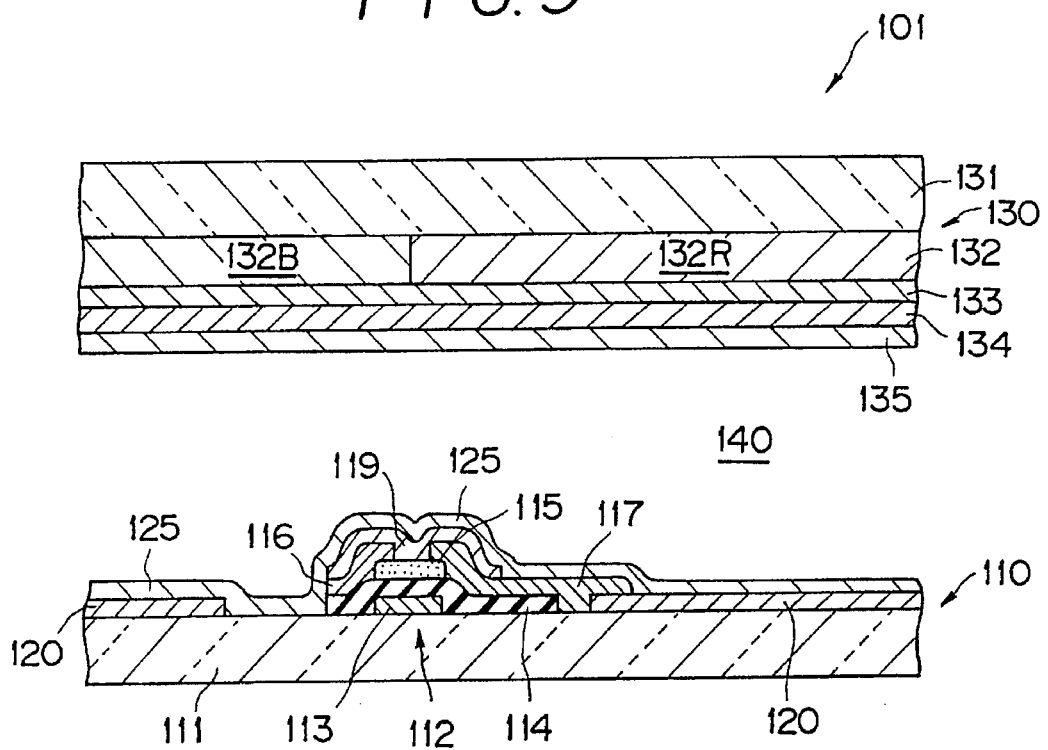
FIG. 9 is a schematic sectional view of the color liquid crystal display panel shown in FIG. 8.

FIG. 8 is a perspective view showing a color liquid crystal display panel of active matrix system which is one example of the liquid crystal display panel of the invention, and FIG. 9 is a schematic sectional view of said color liquid crystal panel. In FIGS. 8 and 9, the color liquid crystal panel 101 is constructed by placing a TFT substrate 110 and a color filter 130 to face each other by way of a sealing material (not shown), sealing a liquid crystal layer 140 made of a twisted nematic (TN) liquid crystal and having a thickness of about 5 to 10 μm between a substrate of the TFT substrate and a substrate of the color filter, and arranging polarizing films 150 and 151 on outer sides of the color filter 130 and the TFT substrate 110, respectively.

The TFT substrate includes a transparent substrate 111, a semiconductor device 112 and pixel electrodes 120, said semiconductor device and said pixel electrodes being formed integrally with each other on the transparent substrate. Each of the pixel electrodes 120 is provided correspondingly to each color pattern of the color filter 130 which will be described later, and among the pixel electrodes 120 is laid a scanning line (gate bus line) 123a and a data line 123b. The semiconductor device 112 is a thin film transistor (TFT) composed of a gate electrode 113, a gate insulating layer 114, a semiconductor layer 115 made of amorphous silicon (a-Si) or the like, a source electrode 116 and a drain electrode 117. One end of the drain electrode 117 is connected with the semiconductor layer 115, and the other end thereof is connected with the pixel electrode 120. On the source electrode 116 and the drain electrode 117 of the semiconductor device 112 is formed a light-shielding layer 119 so that the semiconductor layer 115 is shielded from light. Further, an orientation layer 125 is formed to cover the semiconductor device 112 and the pixel electrodes 120.

The color filter 130 includes a transparent substrate 131, a colored layer 132 formed on the transparent substrate 131, a overcoat 133 formed to cover the colored layer 132, a transparent electrode 134 and an orientation layer 135. This color filter 130 is arranged so that the orientation layer 135 is positioned on the side of the liquid crystal layer 140. The colored layer 132 is composed of a red pattern 132R, a green pattern 132G and a blue pattern 132B, and the arrangement of those color patterns is mosaic arrangement as shown in FIG. 8. The arrangement of the color patterns is in no way limited to the mosaic arrangement, and other arrangements such as triangle arrangement and stripe arrangement are also available.

In such a color liquid crystal display panel 101 as mentioned above, each of the color patterns 132R, 132G and 132B constitutes a pixel. When the pixel electrode 120 corresponding to each pixel is switched on or off under irradiation with light from the side of the polarizing film 151, the liquid crystal layer 140 acts as a shutter and the light is transmitted by each pixels of the color patterns 132R, 132G and 132B to effect color display.

Examples of materials employable for the transparent substrates 111 and 131 constituting TFT substrate 110 and the color filter 130, respectively, include rigid materials having no flexibility such as quartz glass, low-expanded glass and soda-lime glass, and flexible materials having flexibility such as transparent resin film and optical resin plate. Among various materials, a 7059 glass (available from Corning Corporation) is particularly suitable for the color liquid crystal display panel of active matrix system, because it has a small coefficient of thermal expansion and is excellent in dimensional stability and workability in a high temperature heating treatment, and further it is a non-alkali glass containing no alkali component.

The semiconductor device 112 (TFT) composed of the gate electrode 113, the gate insulating layer 114, the semiconductor layer 115, the source electrode 116 and the drain electrode 117 can be formed by conventionally known methods.

The light-shielding layer 119 provided on the source electrode 116 and the drain electrode 117 to shield the semiconductor layer 115 of the semiconductor device 112 from light is formed, for example, by the following process including electroless plating. That is, the whole surface of the transparent substrate 111 including the semiconductor layer 115, the source electrode 116 and the drain electrode 117 is coated with a photosensitive resin containing a hydrophilic resin to form a photosensitive resin layer having a thickness of about 0.1 to 5.0 μm, preferably about 0.1 to 2.0 μm. Then, the photosensitive resin layer is exposed to light through a photo mask for a light-shielding layer 119. After the exposure, the photosensitive resin layer is developed to form a relief having a pattern for a light-shielding layer on the pre-determined areas of the source electrode 116 and the drain electrode 117. Thereafter, the transparent substrate 111 is immersed in an aqueous solution of a metallic compound serving as a catalyst for electroless plating, then washed with water, dried, and subjected to a heat treatment (50° to 200° C., 5 to 30 minutes), to form a catalyst-containing relief. The transparent substrate 111 is further immersed in an electroless plating solution to bring the catalyst-containing relief into contact with the electroless plating solution, whereby metallic particles deposit inside of the relief. Thus, a light-shielding layer 119 was formed.

In the process for preparing a liquid crystal display panel according to the invention, the catalyst-containing relief may be formed by a process comprising forming a relief as above, then conducting a heat treatment (70° to 150° C., 5 to 30 minutes), immersing the transparent substrate 111 in an aqueous solution of a metallic compound serving as a catalyst for electroless plating, washing with water and drying the substrate. In this case, it is preferred to further conduct a heat treatment (150° to 250° C., 30 minutes to 2 hours) after the light-shielding layer 119 is formed by electroless plating. By conducting the heat treatment before the formation of the catalyst-containing relief as described above, the relief can be uniformly dried, and the aqueous solution of a metallic compound serving as a catalyst for electroless plating uniformly permeates into the relief. Further, a period of time required for the electroless plating can be controlled by adjusting conditions of the heat treatment. Accordingly, metal particles deposit almost uniformly within the whole of the catalyst-containing relief, and thereby the resulting light-shielding layer 119 is almost free from lifting, peeling off, etc.

The light-shielding layer 119 may be also formed by the following process including electroless plating. That is, a photosensitive resin containing a hydrophilic resin and an aqueous solution of a metallic compound serving as a catalyst for electroless plating is applied onto the transparent substrate 111, to form a photosensitive resin layer having a thickness of about 0.1 to 5 μm, preferably about 0.1 to 2.0 μm. Then, the photosensitive resin layer is exposed to light through a photo mask for a light-shielding layer 119, and thus exposed photosensitive resin layer is developed and dried to form a catalyst-containing relief having a pattern for a light-shielding layer. Thereafter, a heat treatment (70° to 150° C., 5 to 30 minutes) may be carried out. Then, the transparent substrate 111 is immersed in an electroless plating solution to bring the catalyst-containing relief into contact with the electroless plating solution, whereby metallic particles deposit inside of the catalyst-containing relief. Thus, a light-shielding layer 119 was formed.

As the photosensitive resin and the hydrophilic resin to be contained in the photosensitive resin, there can be employed those described before in the process for preparing a black matrix substrate, and concrete examples thereof are omitted herein.

In a case where the light-shielding layer 119 is formed from a metal layer of chromium thin film or the like, leakage of current takes place between the source electrode 116 and the drain electrode 117. If an insulating layer is provided between the light-shielding layer 119 and the electrode in order to prevent the leakage of current, a condenser is formed, so that provision of such insulating layer is unfavorable. In the present invention, however, the light-shielding layer is formed by depositing metallic particles inside of the catalyst-containing relief by electroless plating as described above, so that the light-shielding layer has sufficiently high specific resistance.

Figure 10:
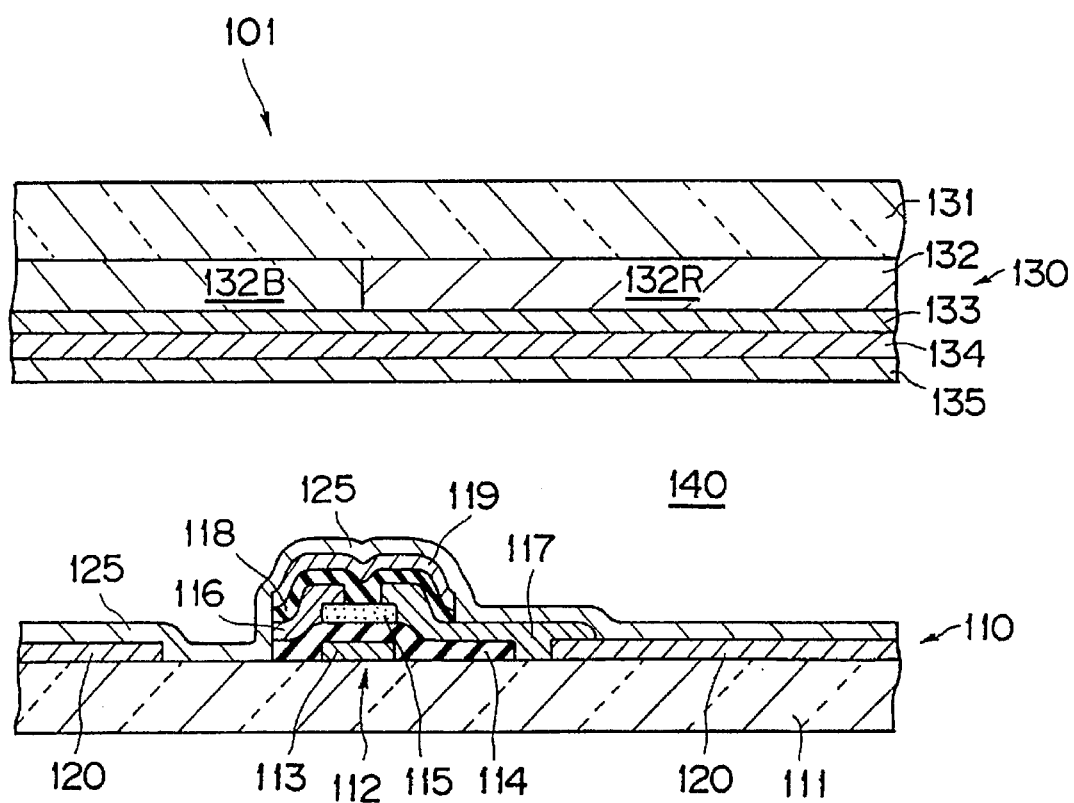
FIG. 10 is a schematic sectional view showing a color liquid crystal display panel which is other example of a liquid crystal display panel according to the invention.

FIG. 10 is a schematic sectional view showing a color liquid crystal display panel which is other example of the liquid crystal display panel according to the invention. The color liquid crystal display panel shown in FIG. 10 is the same as the color liquid crystal display panel shown in FIG. 9 except that the light-shielding layer 119 is provided by way of an insulating layer 118. In FIGS. 9 and 10, the same numerals designate corresponding parts to each other.

The insulating layer 118 of the color liquid crystal display panel shown in FIG. 10 can be formed from known insulating materials such as $SiN_x$. Owing to the insulating layer 118, the semiconductor device 112 is effectively isolated from the light-shielding layer 119, and thereby contamination of the semiconductor layer 115 caused by the light-shielding layer 119 and leakage of current between the source electrode 116 and the drain electrode 117 can be surely prevented.

The light-shielding layer 119 can be formed on the source electrode 116 and the drain electrode 117 so as to cover the semiconductor layer 115 of the semiconductor device 112 by way of the insulating layer 118 in accordance with the aforementioned method for forming the light-shielding layer, so that detailed description on the formation of the light-shielding layer 119 is omitted herein.

As the metallic compound serving as a catalyst for electroless plating and the electroless plating solution, there can be employed those described before in the process for preparing a black matrix substrate, and concrete examples thereof are omitted herein.

In such a color filter 130 as mentioned above, the colored layer 132 composed of a red pattern 132R, a green pattern 132G and a blue pattern 132B can be formed by conventionally known methods such as dyeing method, dispersing method, printing method and electrodeposition.

The overcoat 133 provided to cover the colored layer 132 of the color filter 130 is for the purpose of improving surface roughness of the color filter 130, enhancing reliability thereof and preventing contamination of the liquid crystal layer 140. The overcoat 133 can be formed using transparent resins such as acrylic resins, epoxy resins and polyimide resins, melamine resin or transparent inorganic compounds such as silicon dioxide. A thickness of the overcoat is preferably in the range of 0.1 to 10 μm.

An indium tin oxide (ITO) film can be used as the transparent electrode 134 in FIG. 9 or FIG. 10. The ITO film can be formed by a conventional method such as sputtering. A thickness of the ITO film is preferably in the range of 200 to 2,000 Å.

As the orientation layer 125 of the TFT substrate 110 and the orientation layer 135 of the color filter 130, there can be used those formed by known methods such as a layer formed by oblique deposition, a layer formed by application of an organic orientating agent having cyano group, carboxylic group or the like, or a layer made of polyimide resin The present invention is described in more detail by the following experiment examples.

EXPERIMENT EXAMPLE 4

A 7059 glass (available from Corning Corporation, thickness: 1.1 mm) was used as a transparent substrate. On the pre-determined areas were formed a gate electrode and a pixel electrode using aluminum (Al). Then, a $SiN_x$ layer as a gate insulating layer was formed so that the gate electrode was covered, and an amorphous silicon (a-Si) layer was formed on the gate electrode by way of the $SiN_x$ layer. Further, an Al source electrode is formed to be connected with one end of the a-Si layer, and an Al drain electrode is formed to be connected with the other end of the a-Si layer and with the pixel electrode.

Subsequently, a photosensitive resin having the following composition was applied onto the transparent substrate by means of spin coating (rotation speed: 1,000 r.p.m.), and the photosensitive resin was dried at 70° C. for 5 minutes to form a photosensitive resin layer (thickness: 1.5 μm).

Composition of the photosensitive resin

A 10% aqueous solution of polyvinyl alcohol (Gosenal T-330, available from Nippon Gosei Kagaku K.K.) 20 parts by weight A 20% aqueous solution of diazo resin (D-011, available from Shinko Giken K.K.) 0.8 part by weight Water 15 parts by weight Then, the photosensitive resin layer was exposed to light through a photo mask for a light-shielding layer. In the exposure, an ultra-high-pressure mercury lamp (2 kw) was used as a light source, and irradiation with the light was carried out for 10 seconds. Thereafter, the photosensitive resin layer was subjected to spray development using water of a normal temperature and then subjected to air drying, to form a relief for a light-shielding layer having a line width of 1.0 μm on the pre-determined area including the a-Si layer, the source electrode and the drain electrode.

Subsequently, the transparent substrate was immersed in an aqueous solution of palladium chloride (Red Sumer, available from Nippon Kanigen K.K.) for 10 seconds, then washed with water and hydro-extracted. The transparent substrate was then subjected to a heat treatment at 150° C. for 15 minutes to make the above relief a catalyst-containing relief.

The transparent substrate was then immersed in a nickel plating solution of 30° C. containing a boron type reductant (Top Chemialloy B-1, nickel plating solution available from Okuno Seiyaku K.K.) for 3 minutes, then washed with water and dried to form a light-shielding layer.

The light-shielding layer was measured on an optical density OD and a reflectance R at a wavelength of 545 nm. As a result, the optical density OD was not less than 3.0 and the reflectance R was not more than 5%.

Further, a dilute solution of polyimide resin was applied onto the transparent substrate and dried to form an orientation layer (thickness: 0.05 μm). Thus, a TFT substrate was obtained.

Separately, a 7059 glass (available from Corning Corporation, thickness: 1.1 mm) was used as a transparent substrate, and colored layers of R, G and B were formed on the transparent substrate correspondingly to the above pixel electrodes in accordance with a known dyeing method.

Onto the colored layers, a dilute solution of acrylic resin was applied, and the solution was dried to form a heat-resistant overcoat. Further, a transparent electrode (ITO) was formed on the overcoat in accordance with a conventional manner. Then, a dilute solution of polyimide resin was applied onto the transparent electrode and dried to form an orientation layer (thickness: 0.05 µm). Thus, a color filter was obtained.

Using the TFT substrate and the color filter obtained as above, a color liquid crystal display panel of active matrix system was prepared. In this color liquid crystal display panel, the semiconductor device on the TFT substrate was effectively protected by the light-shielding layer, and the panel showed high brightness and high contrast because of its high aperture ratio.

EXPERIMENT EXAMPLE 5

On the pre-determined areas of a transparent substrate were formed a gate electrode, a pixel electrode, a gate insulating layer of a $SiN_x$ layer, an amorphous silicon (a-Si) layer, an Al source electrode and an Al drain electrode in the same manner as described in Experiment Example 4. Then, on the transparent substrate was formed a photosensitive resin layer in the same manner as described in Experiment Example 4, and the photosensitive resin layer was exposed to light and developed. Thereafter, the transparent substrate was subjected to a heat treatment at 100° C. for 30 minutes to form a relief for a light-shielding layer having a line width of 1.0 µm on the pre-determined area including the a-Si layer, the source electrode and the drain electrode.

Subsequently, the transparent substrate was immersed in an aqueous solution of palladium chloride (Red Sumer, available from Nippon Kanigen K.K.) for 10 seconds, then washed with water and hydro-extracted to make the above relief a catalyst-containing relief.

The transparent substrate was then immersed in a nickel plating solution of 30° C. containing a boron type reductant (Top Chemialloy B-1, nickel plating solution available from Okuno Seiyaku K.K.) for 3 minutes, washed with water and dried to form a light-shielding layer. The transparent substrate was then subjected to a heat treatment at 200° C. for 1 hour.

The light-shielding layer was measured on an optical density OD and a reflectance R at a wavelength of 545 nm. As a result, the optical density OD was not less than 3.0 and the reflectance R was not more than 5%.

Further, a dilute solution of polyimide resin was applied onto the transparent substrate and dried to form an orientation layer (thickness: 0.05 µm). Thus, a TFT substrate was obtained.

Using the TFT substrate obtained as above and the color filter obtained in Experiment Example 4, a color liquid crystal display panel of active matrix system was prepared in the same manner as described in Experiment Example 4. In this color liquid crystal display panel, the semiconductor device on the TFT substrate was effectively protected by the light-shielding layer, and the panel showed high brightness and high contrast because of its high aperture ratio.

EXPERIMENT EXAMPLE 6

The procedure for preparing the TFT substrate in Experiment Example 4 was repeated except for the light-shielding layer was formed by the process described below. That is, a photosensitive resin having the following composition was applied onto the transparent substrate on which a light-shielding layer would be provided by means of spin coating (rotation speed: 1,000 r.p.m.), and the photosensitive resin was dried at 70° C. for 5 minutes to form a photosensitive resin layer (thickness: 1.5 µm).

Composition of the photosensitive resin

A 10% aqueous solution of polyvinyl alcohol (Gosenal T-330, available from Nippon Gosei Kagaku K.K.) 20 parts by weight A 20% aqueous solution of diazo resin (D-011, available from Shinko Giken K.K.) 0.8 part by weight An aqueous solution of palladium chloride (Red Sumer, available from Nippon Kanigen K.K.) 15 parts by weight Then, the photosensitive resin layer was exposed to light through a photo mask for a light-shielding layer under the same conditions as those in Experiment Example 3. Thereafter, the photosensitive resin layer was subjected to spray development using water of a normal temperature, and subjected to air drying to form a catalyst-containing relief for a light-shielding layer having a line width of 1.0 µm.

Subsequently, the transparent substrate was immersed in a nickel plating solution of 30° C. containing a boron type reductant (Top Chemialloy B-1, nickel plating solution available from Okuno Seiyaku K.K.) for 20 seconds, and further immersed in a nickel plating solution of 30° C. containing a hypophosphorous acid type reductant (Tsp55 Nickel, nickel plating solution available from Okuno Seiyaku K.K., A/C=½) for 2 minutes, then washed with water and dried to form a light-shielding layer. The transparent substrate was then subjected to a heat treatment at 200° C. for 1 hour.

The light-shielding layer was measured on an optical density OD and a reflectance R at a wavelength of 545 nm. As a result, the optical density OD was not less than 3.0 and the reflectance R was not more than 5%.

Using the TFT substrate obtained as above and the color filter obtained in Experiment Example 4, a color liquid crystal display panel of active matrix system was prepared in the same manner as described in Experiment Example 4. In this color liquid crystal display panel, the semiconductor device on the TFT substrate was effectively protected by the light-shielding layer, and the panel showed high brightness and high contrast because of its high aperture ratio.

EXPERIMENT EXAMPLE 7

On the pre-determined areas of a transparent substrate were formed a gate electrode, a pixel electrode, a gate insulating layer of a $SiN_x$ layer, an amorphous silicon (a-Si) layer, an Al source electrode and an Al drain electrode in the same manner as described in Experiment Example 4. Then, on the pre-determined area including the a-Si layer, the source electrode and the drain electrode was formed a $SiN_x$ layer as an insulating layer. On the insulating layer was then formed a light-shielding layer in the same manner as described in Experiment Example 4.

Subsequently, using the TFT substrate obtained as above and the color filter obtained in Experiment Example 4, a color liquid crystal display panel of active matrix system was prepared in the same manner as described in Experiment Example 4. In this color liquid crystal display panel, the semiconductor device on the TFT substrate was effectively protected by the light-shielding layer, and the panel showed high brightness and high contrast because of its high aperture ratio.

POSSIBILITY OF INDUSTRIAL USE

As described above, the black matrix substrate of the present invention can be used for a flat display such as a liquid crystal display panel, an imager such as CCD, or a color filter such as a color sensor, and the liquid crystal display panel of the present invention can be used as a flat display of high precision and high contrast.

What is claimed is:

1. A black matrix substrate comprising a transparent substrate and a light-shielding layer provided on said transparent substrate and formed of a resin layer containing metallic particles formed inside thereof, wherein said resin layer is formed by exposing, to light, a photosensitive resist layer formed on said transparent substrate and containing a hydrophilic resin through a photo mask having a pattern for the light-shielding layer and, thereafter, carrying out an electroless plating process to thereby deposit the metallic particles in the resist layer.

2. The black matrix substrate as claimed in claim 1, wherein the light-shielding layer has a thickness ranging from 0.1 to 5 µm.

3. The black matrix substrate as claimed in claim 1, wherein the light-shielding layer has a thickness ranging from 0.1 to 2 µm.

4. The black matrix substrate as claimed in claim 1, wherein the light-shielding layer has a reflectance of not more than 30%.

5. The black matrix substrate as claimed in claim 4, wherein the light-shielding layer has a thickness ranging from 0.1 to 5 µm.

6. The black matrix substrate as claimed in claim 1, wherein the light-shielding layer has an optical density of not less than 1.5.

7. The black matrix substrate as claimed in claim 6, wherein the light-shielding layer has a thickness ranging from 0.1 to 5 µm.

8. The black matrix substrate as claimed in claim 7, wherein the metallic particles contained in the light-shielding layer have particle diameters of not more than 0.05 µm.

9. The black matrix substrate as claimed in claim 8, wherein the light-shielding layer has a thickness ranging from 0.1 to 5 µm.

10. The black matrix substrate as claimed in claim 9, wherein the light-shielding layer has a reflectance of not more than 30%.

11. The black matrix substrate as claimed in claim 10, wherein the light-shielding layer has an optical density of not less than 1.5.

12. The black matrix substrate as claimed in claim 1, wherein the light-shielding layer has a reflectance of not more than 30%.

13. A liquid crystal display panel comprising substrates facing each other and a liquid crystal sealed between said substrates, wherein at least one of said substrates is provided with a semiconductor device having a light-shielding layer which is formed of a resin layer containing metallic particles formed inside thereof, and said resin layer is formed by exposing, to a light, a photosensitive resist layer formed on a side of the semiconductor device provided for the substrate and containing hydrophilic resin through a photo mask having a pattern for the light-shielding layer and, thereafter, carrying out an electroless plating process to thereby deposit the metallic particles in the resist layer.

14. The liquid crystal display panel as claimed in claim 13, wherein the light-shielding layer is provided on the semiconductor device by the medium of an insulating layer.

15. The liquid crystal display panel as claimed in claim 13, wherein the light-shielding layer has a thickness ranging from 0.1 to 5 µm.

16. The liquid crystal display panel as claimed in claim 13, wherein the light-shielding layer has a thickness ranging from 0.1 to 2 µm.

17. The liquid crystal display panel as claimed in claim 13, wherein the light-shielding layer has a reflectance of not more than 30%.

18. The liquid crystal display panel as claimed in claim 17, wherein the light-shielding layer has a thickness ranging from 0.1 to 5 µm.

19. The liquid crystal display panel as claimed in claim 13, wherein the light-shielding layer has an optical density of not less than 1.5.

20. The liquid crystal display panel as claimed in claim 19, wherein the light-shielding layer has a thickness ranging from 0.1 to 5 µm.

21. The liquid crystal display panel as claimed in claim 20, wherein the light-shielding layer has a reflectance of not more than 30%.

22. The liquid crystal display panel as claimed in claim 13, wherein the metallic particles contained in the light-shielding layer have particle diameters of not more than 0.05 µm.

23. The liquid crystal display panel as claimed in claim 22, wherein the light-shielding layer has a thickness ranging from 0.1 to 5 µm.

24. The liquid crystal display panel as claimed in claim 23, wherein the light-shielding layer has a reflectance of not more than 30%.

25. The liquid crystal display panel as claimed in claim 24, wherein the light-shielding layer has an optical density of not less than 1.5.

* * * * *